(12) United States Patent
Eilertsen

(10) Patent No.: US 12,527,220 B2
(45) Date of Patent: Jan. 13, 2026

(54) MANUFACTURE OF THERMOELECTRIC GENERATORS AND OTHER DEVICES THAT INCLUDE METASTRUCTURES

(71) Applicant: NIL Technology ApS, Kongens Lyngby (DK)

(72) Inventor: James Eilertsen, Kongens Lyngby (DK)

(73) Assignee: NIL Technology ApS, Kongens Lyngby (DK)

( * ) Notice: Subject to any disclaimer, the term of this patent is extended or adjusted under 35 U.S.C. 154(b) by 288 days.

(21) Appl. No.: 18/027,449

(22) PCT Filed: Sep. 24, 2021

(86) PCT No.: PCT/EP2021/076337
§ 371 (c)(1),
(2) Date: Mar. 21, 2023

(87) PCT Pub. No.: WO2022/069362
PCT Pub. Date: Apr. 7, 2022

(65) Prior Publication Data
US 2023/0337539 A1  Oct. 19, 2023

Related U.S. Application Data

(60) Provisional application No. 63/085,431, filed on Sep. 30, 2020.

(51) Int. Cl.
*H10N 10/01* (2023.01)
*G03F 7/00* (2006.01)
*H10N 10/17* (2023.01)

(52) U.S. Cl.
CPC ........... *H10N 10/01* (2023.02); *G03F 7/0002* (2013.01); *H10N 10/17* (2023.02)

(58) Field of Classification Search
CPC ........ H10N 10/01; H10N 10/17; H10N 10/10; H10N 10/852; G03F 7/0002
See application file for complete search history.

(56) References Cited

U.S. PATENT DOCUMENTS

| 2018/0045856 A1* | 2/2018 | Hong | G02B 1/007 |
| 2020/0028049 A1* | 1/2020 | Hussein | H10N 10/82 |

FOREIGN PATENT DOCUMENTS

| EP | 1796182 | 6/2007 |
| EP | 2131406 | 12/2009 |

(Continued)

OTHER PUBLICATIONS

Böttner et al., "New thermoelectric components using microsystem technologies," Journal of Microelectromechanical Systems, 2004, 13(3):414-420.

(Continued)

*Primary Examiner* — Michael Y Sun
(74) *Attorney, Agent, or Firm* — Fish & Richardson P.C.

(57) ABSTRACT

A method for manufacturing thermoelectric generators or other devices includes imprinting a first replication layer to form a first metastructure, and imprinting a second replication layer to form a second metastructure. The first replication layer is composed of nanoparticles embedded in a polymer, and is disposed on a surface of a first substrate that includes first electrical contacts. The second replication layer also is composed of nanoparticles embedded in a polymer, and is disposed on a surface of a second substrate that includes second electrical contacts. The method includes bonding meta-atoms of the second metastructure to the first electrical contacts, and bonding meta-atoms of the first metastructure to the second electrical contacts, such that respective ones of the meta-atoms of the first metastructure (Continued)

are connected electrically in series with respective ones of the meta-atoms of the second metastructure.

3 Claims, 3 Drawing Sheets

(56) References Cited

FOREIGN PATENT DOCUMENTS

| KR | 100984108 | 9/2010 |
|---|---|---|
| KR | 20120019062 | 3/2012 |
| KR | 20150077015 | 7/2015 |
| KR | 20160002608 | 1/2016 |
| WO | WO 2014152570 | 9/2014 |
| WO | WO 2019056586 | 3/2019 |
| WO | WO 2020184235 | 9/2020 |

OTHER PUBLICATIONS

International Search Report and Written Opinion in International Appln. No. PCT/EP2021/076337, dated Jan. 12, 2022, 12 pages.
International Preliminary Report on Patentability in International Appln No. PCT/EP2021/076337, dated Apr. 13, 2023, 8 pages.

* cited by examiner

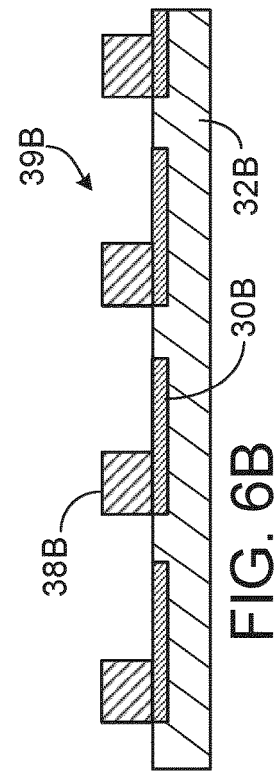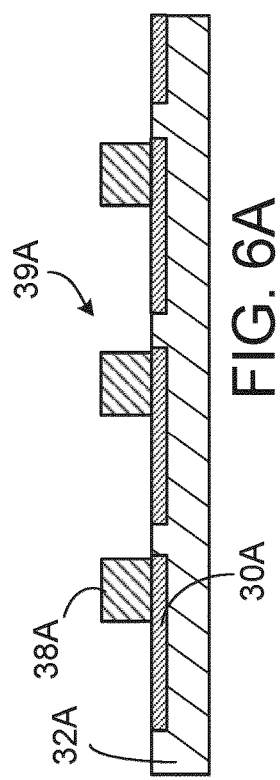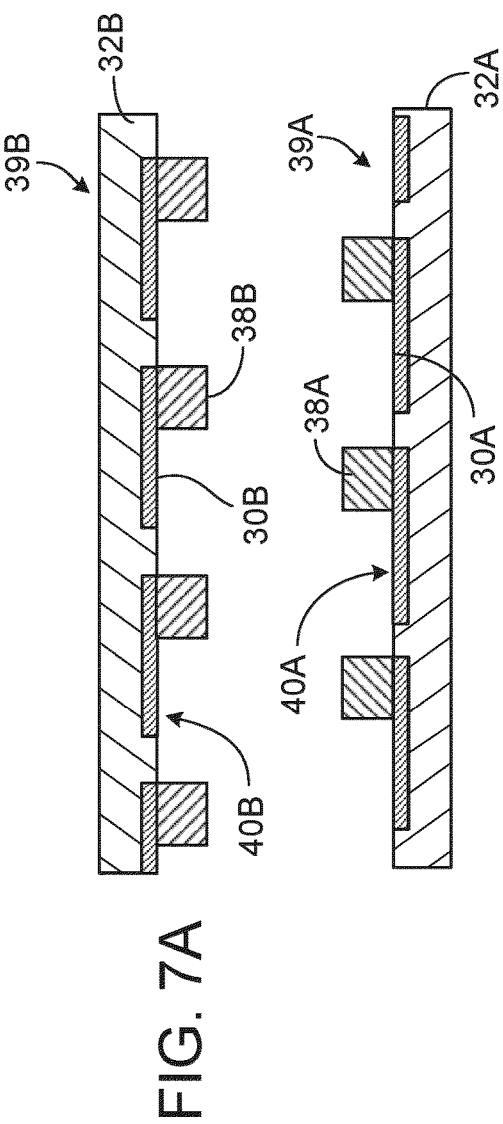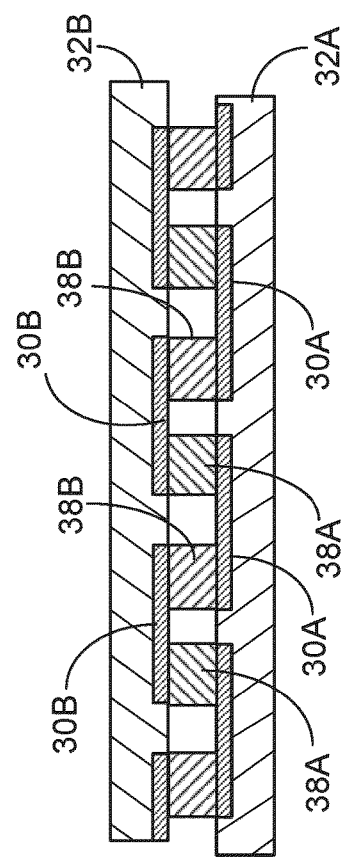

MANUFACTURE OF THERMOELECTRIC GENERATORS AND OTHER DEVICES THAT INCLUDE METASTRUCTURES

CROSS-REFERENCE TO RELATED APPLICATIONS

This application is a National Stage application under 35 U.S.C. § 371 of International Application No. PCT/EP2021/076337, filed on Sep. 24, 2021, which claims priority and benefit from U.S. Provisional Patent Application No. 63/085,431, filed on Sep. 30, 2020, the contents and disclosures of which are incorporated herein by reference in their entirety.

FIELD OF THE DISCLOSURE

The present disclosure relates to the manufacture of thermoelectric generators (TEGs) and other devices that include metastructures.

BACKGROUND

The thermoelectric effect refers to the energy conversion process between thermal and electrical energy. A potential advantage of thermoelectric power generation is the sustainable and reliable conversion of thermal energy into electricity with no moving parts. Thus, in view of the increasing demand for wireless sensor networks and small consumer electronics powered by what would otherwise be wasted heat, TEGs have received attention as a source of sustainable power supply.

Thermoelectric materials, which can be used to generate power directly from heat by converting temperature differences into electric voltage, preferably should have both high electrical conductivity and low thermal conductivity. Low thermal conductivity ensures that when one side becomes relatively hot, the other side stays relatively cold, which helps to generate a large voltage in the presence of a temperature gradient. The measure of the magnitude of electrons flow in response to a temperature difference across that material can be indicated, for example, by what is known as the Seebeck coefficient (S).

SUMMARY

The present disclosure describes techniques for manufacturing TEGs and other devices that include metastructures. Metastructures, which also may be referred to as metasurfaces, refer to surfaces with distributed small structures such as a distributed array of nanostructures. As described in greater detail below, the techniques can include imprinting curable thermo-electrical materials to form the metastructures.

For example, in one aspect, the present disclosure describes a method that includes imprinting a first replication layer to form a first metastructure of first meta-atoms, and imprinting a second replication layer to form a second metastructure of second meta-atoms. The first replication layer is composed of nanoparticles embedded in a polymer, and is disposed on a surface of a first substrate that includes first electrical contacts. The second replication layer also is composed of nanoparticles embedded in a polymer, and is disposed on a surface of a second substrate that includes second electrical contacts. The method further includes bonding meta-atoms of the second metastructure to the first electrical contacts, and bonding meta-atoms of the first metastructure to the second electrical contacts, such that respective ones of the meta-atoms of the first metastructure are connected electrically in series with respective ones of the meta-atoms of the second metastructure.

In another aspect, the present disclosure describe a method that includes imprinting a first replication layer to form a first metastructure comprising first thermoelements, and imprinting a second replication layer to form a second metastructure comprising second thermoelements. The first replication layer is composed of nanoparticles embedded in a polymer, and is disposed on a surface of a first substrate that includes first electrical contacts. The second replication layer also is composed of nanoparticles embedded in a polymer, and is disposed on a surface of a second substrate that includes second electrical contacts. The second replication layer has a conductivity type opposite that of the first replication layer. The method further includes bonding the second thermoelements to the first electrical contacts, and bonding the first thermoelements to the second electrical contacts, such that respective ones of the first thermoelements are connected electrically in series, and thermally in parallel, with respective ones of the second thermoelements.

In some implementations, the first replication layer and the second replication layer have the same composition as one another, whereas in other implementations, the first replication layer and the second replication layer have different compositions from one another.

Some implementations include one or more of the following features. For example, imprinting the first replication layer can include pressing a first stamp into the first replication layer, and imprinting the second replication layer can include pressing a second stamp into the second replication layer. In some implementations, the method includes curing material of the first replication layer after pressing the first stamp into the first replication layer, and curing material of the second replication layer after pressing the second stamp into the second replication layer. Further, some implementations include removing the first stamp after curing the material of the first replication layer, and removing the second stamp after curing the material of the second replication layer.

In some implementations, the method includes, prior to the bonding, aligning the first and second substrates such that the second meta-atoms (e.g., thermoelements) are aligned with exposed portions of the first electrical contacts, and such that the first meta-atoms (e.g., thermoelements) are aligned with exposed portions of the second electrical contacts.

In some implementations, at least one of the polymer of the first replication layer or the polymer of the second replication layer is a curable resist. In some implementations, at least one of the polymer of the first replication layer or the polymer of the second replication layer is a photo-curable resist. In some implementations, at least one of the polymer of the first replication layer or the polymer of the second replication layer is a thermally curable resist.

In some implementations, the nanoparticles of at least one of the first replication layer or the second replication layer include bismuth chalcogenides. In some implementations, the nanoparticles of at least one of the first replication layer or the second replication layer include bismuth telluride. Other materials for the replication layers may be used in some instances.

In some implementations, the method further includes applying a heat treatment to at least one of the first or second meta-atoms (e.g., thermoelements) to increase a density of the nanoparticles. Applying the heat treatment can include, for example, sintering.

In some implementations, after the bonding, the first and second substrates, the first and second electrical contacts, and the first and second thermoelements, form parts of a thermoelectric generator module. The method can include, for example, incorporating the thermoelectric generator module into a health-related sensor device or incorporating the thermoelectric generator module into a wearable device.

Some implementations include one or more of the following advantages. For example, the use of imprinting can, in some implementations, facilitate relatively inexpensive mass production of TEG or other modules. Further, the technique can, in some cases, avoid the need for etching steps, thereby resulting in a simpler manufacturing process. Further, in some instances, efficiency of the TEG modules may be enhanced.

Other aspects, features and advantages will be readily apparent from the following detailed description, the accompanying drawings, and the claims.

BRIEF DESCRIPTION OF THE DRAWINGS

FIGS. 3A-3B, 4A-4B, 5A-5B, 6A-6B, and 7A-7B illustrate various aspects of a process for manufacturing TEG or other modules.

DETAILED DESCRIPTION

Figure 1:
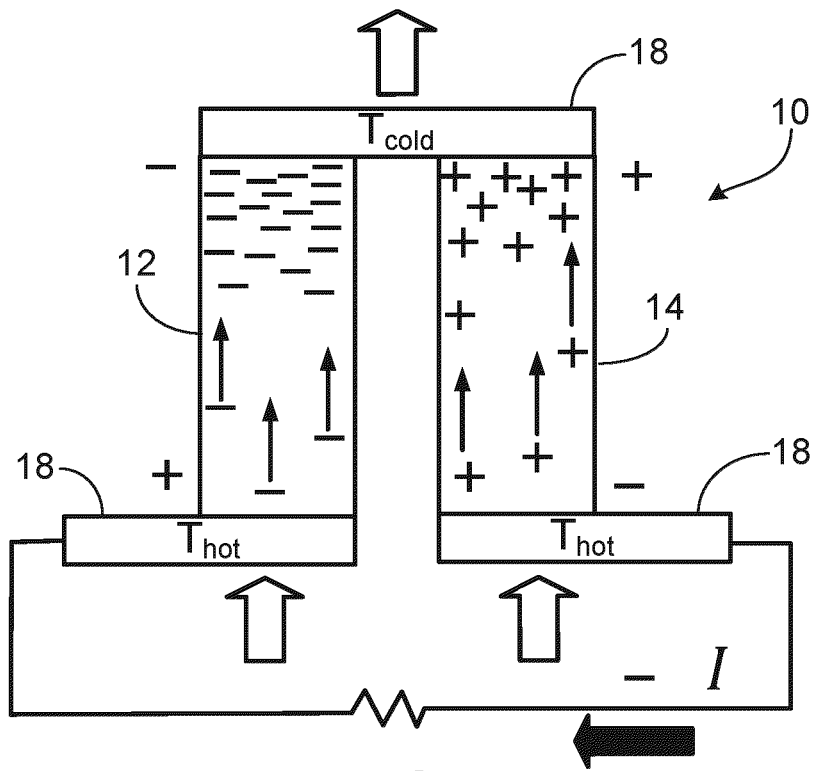
FIG. 1 illustrates an example of a TEG module.

FIG. 1 illustrates a schematic of a TEG module 10 including a circuit containing thermoelectric materials that generate electricity from heat directly. The TEG module 10 includes two dissimilar thermoelectric materials 12, 14 joined at their ends and configured as a thermoelectric generator: an n-type semiconductor (with negative charge carriers) 12 and a p-type semiconductor (with positive charge carriers) 14. Thus, the materials 12, 14 have different Seebeck coefficients from one another. Direct electric current flows in the circuit when there is a temperature difference between the ends of the materials 12, 14. In general, the current magnitude is directly proportional to the temperature difference.

Figure 2:
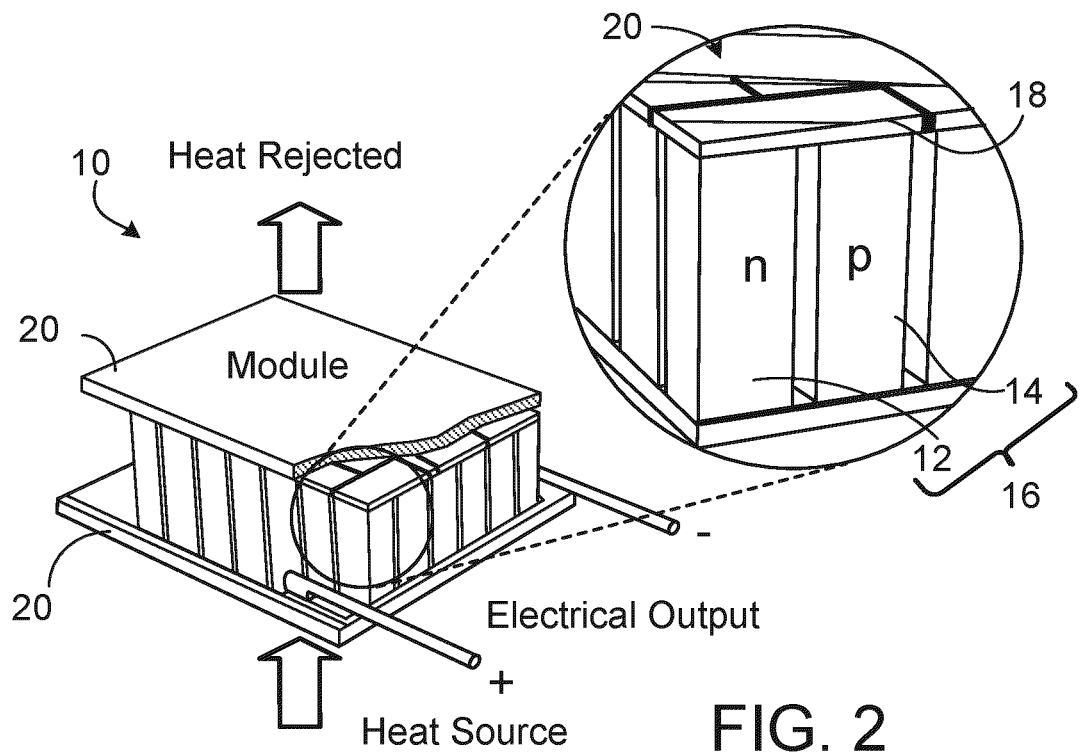
FIG. 2 illustrates further details of a TEG module.

As shown in FIG. 2, the TEG module 10 includes multiple pairs of n- and p-type thermoelements 16 that form legs so as to facilitate generation of sufficient electrical power to operate, for example, small consumer electronic devices (e.g., wearable devices). The n- and p-type thermoelements 16 are connected electrically in series, and thermally in parallel, with one another. The thermoelements 16 also are connected to electrically conductive (e.g., metal) interconnects 18, which can be disposed on substrates 20. The module 10 further can include electrical wires 22 to provide the electrical output.

As described below, a technique for manufacturing solid state TEG modules includes imprinting a curable thermoelectrical material to form the legs (i.e., the thermoelements 16) of the TEG generator. "Imprinting," as used in this disclosure, may include, for example, one or more of embossing, debossing, stamping, or nano-imprinting. The use of imprinting can, in some implementations, facilitate relatively inexpensive mass production of the TEG modules. Further, the technique can, in some cases, avoid the need for etching steps, thereby resulting in a simpler manufacturing process than at least some other processes. Further, in some instances, efficiency of the TEG modules may be enhanced.

Figure 3A:
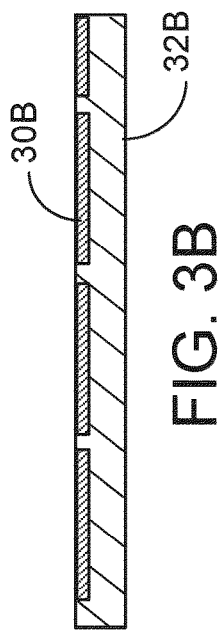
Figure 3B:
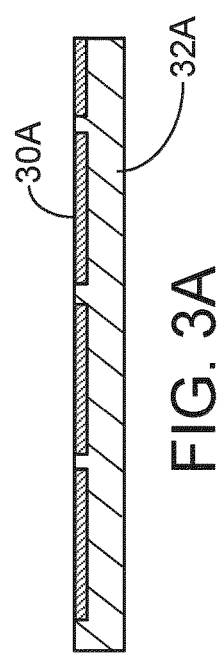

As shown in FIGS. 3A and 3B, electrical contacts 30A, 30B, respectively, are deposited and patterned in or on first and second substrates 32A, 32B. The substrates 32A, 32B can be composed, for example, of a relatively flexible material (e.g., a cured resist) or a relatively rigid material (e.g., silicon or fused silica). The electrical contacts 30A, 30B preferably are composed of a metal or other material that exhibits relatively low contact resistance (e.g., gold or silver).

Figure 4A:
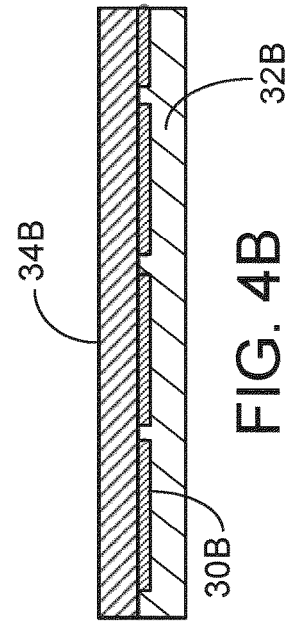
Figure 4B:
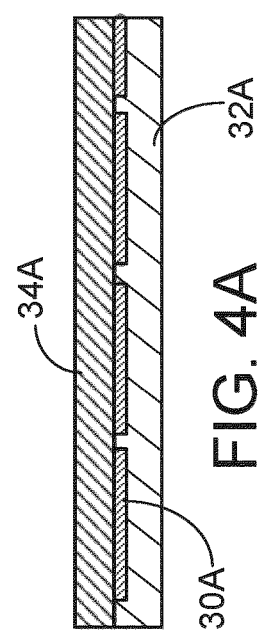

Next, as shown in FIGS. 4A and 4B, a respective replication layer 34A, 34B containing a mixture of nanoparticles and a polymer is deposited over each of the substrates 32A, 32B, in particular over the surface on which the electrical contacts 30A, 30B respectively are present. Examples of methods for depositing the replication material include printing (e.g., inkjet printing), jetting, dispensing, screen printing, dip coating, and spin coating. The replication layer 34A, which contains an n-type mixture of the nanoparticles and polymer, is deposited on a surface of the first substrate 32A, whereas the replication layer 34B, which contains a p-type mixture 34B of the nanoparticles and polymer, is deposited on a surface of the second substrate 32B.

The nanoparticles in the replication layers 34A, 34B preferably are composed of a high efficiency thermoelectric semiconductor material such as bismuth telluride (($Bi_2Te_3$)). In some implementations, other materials can be used for the nanoparticles. For example, in some cases, the nanoparticles are composed of other bismuth chalcogenides, lead tellurides, inorganic clathrates, skutterudites (e.g., $CoSb_3$), half-Heusler alloys, compounds of Mg and group-14 elements, oxide thermoelectric semiconductors, or other thermoelectric semiconductors. In some instances, the composition of the nanoparticles includes nanocomposites containing nano-inclusions, and any of the aforementioned materials as the matrix.

The polymer in the replication layers 34A, 34B can be, for example, a curable resin. In some implementations, the polymer is a photoresist or thermal resist that is curable (e.g., photo-curable and/or thermally curable). In some implementations, other materials can be used for the polymer.

Figure 5A:
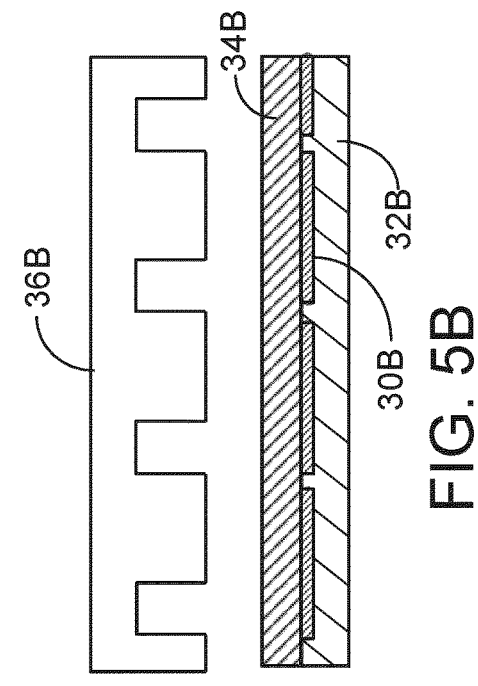
Figure 5B:
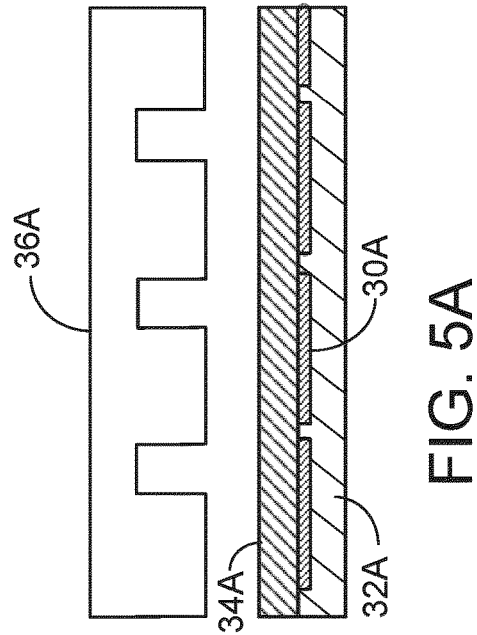

As shown in FIGS. 5A and 5B, following deposition of the replication layers 34A, 34B, imprinting tools (e.g., stamps) 36A, 36B are pressed, respectively, into a respective one of the layers 34A, 34B to form the n-type and p-type thermoelements. In particular, the first imprinting stamp 36A is pressed into the layer 34A and cured to form n-type meta-atoms (i.e., thermoelements) 38A (see FIG. 6A), and the second imprinting stamp 36B is pressed into the layer 34B and cured to form p-type meta-atoms (i.e., thermoelements) 38B (see FIG. 6B). Thus, the imprinting process can include pressing a structured surface of a stamp into a replication material in which nanoparticles are embedded, curing the replication material, and removing the surface of the stamp from contact with the replication material. The curing process may include, for example, a photo-cure and/or a thermal cure, depending on the type of polymer used in for the replication layers 34A, 34B.

The stamps 36A, 36B may be composed of a variety of materials such as a cured replication material and/or a patterned semiconductor wafer (e.g., a patterned silicon wafer), which in some cases can include deposited metal layers. In some implementations, one or both of the stamps 36A, 36B are transparent (e.g., are composed of glass). In some implementations, one or both of the stamps 36A, 36B are thin and/or flexible (e.g., composed of polycarbonate foil). In some implementations, the structured surface of one or both of the stamps 36A, 36B is composed of a polymer (e.g., polydimethylsiloxane (PDMS)).

Each of the stamps 36A, 36B can have a respective pattern or other arrangement of features that represents an inverse image of the pattern or other arrangement to be imprinted into the respective replication layer 30A, 30B. When the stamp 36A, 36B is brought into contact with the replication layer 30A, 30B and is pressed towards the substrate 32A, 32B, the imprinting imparts an inverse image of the features on the surface of the stamp 36A, 36B into the replication layer 30A, 30B.

In some instances, after removing the stamp from the replication layers 34A, 34B, the nanoparticles can be sintered, or some other heat treatment can be applied, so as to increase the density of the meta-atoms. In some cases, sintering the meta-atoms may result in the coalescence of the nanoparticles and removal of at least a portion of the polymer contained in the replication material. In some instances, the sintering or other heat treatment can be performed at a later stage in the process.

The resulting n-type meta-atoms 38A, which serve as n-type thermoelements, form a first metastructure, with each of the thermoelements 38A on a respective one of the electrical contacts 30A (see FIG. 6A). Likewise, the resulting p-type meta-atoms 38B, which serve as p-type thermoelements, form a second metastructure, with each of the thermoelements 38B on a respective one of the electrical contacts 30B (see FIG. 6B). Thus, one sub-assembly 39A (FIG. 6A) includes a metastructure composed of n-type thermoelements 38A, and a second sub-assembly 39B (FIG. 6B) includes a metastructure composed of p-type thermoelements 38B. The size of the thermoelements 38A, 38B may depend on the material, but typically is in the range of 10 nm-300 nm, and preferably should be in the range of 10-100 nm. The size of the metastructure preferably is such that the thermal conductivity is substantially reduced, whereas the electrical conductivity is substantially unaffected or at least is not impacted adversely.

As shown in FIG. 7A, one of the subassemblies (e.g., subassembly 39B) is flipped over and is aligned over the other one of the subassemblies (e.g., subassembly 39A). In the illustrated example, the thermoelements 38B of the second subassembly 39B are aligned above exposed portions 40A of the electrical contacts 30A in the first subassembly 39A. Likewise, the thermoelements 38A of the first subassembly 39A are aligned below exposed portions 40B of the electrical contacts 30B in the second subassembly 39B.

Next, the two subassemblies 39A, 39B are brought into contact with one another, as shown in FIG. 7B. The subassemblies can be heat-treated so as to bond the electrical contacts 30A, 30B and thermoelements 38A, 38B to one another. In particular, the thermoelements 38B are bonded to the electrical contacts 30A, and the thermoelements 38A are bonded to the electrical contacts 30B. Thus, in the resulting assembly, the n- and p-type thermoelements 38A, 38B are connected electrically in series, and thermally in parallel, with one another, such that the electrical contacts 30A, 30B serve as the electrical interconnects (i.e., the interconnects 18 in FIG. 2). Electrical wires (e.g., wires 22 in FIG. 2) can be provided to the assembly for the electrical output. In some instances, the heat treatment applied to the subassemblies 39A, 39B to bond the electrical contacts 30A, 30B and thermoelements 38A, 38B to one another also can result in an increase in the density of the meta-atom (e.g., by causing the nanoparticles to coalesce). In some cases, the heat treatment applied to the subassemblies sinters the meta-atoms and causes the nanoparticles to coalesce. In some implementations, two different heat treatments may be performed sequentially at this stage in the process. That is, a first heat treatment can be performed to bond the electrical contacts 30A, 30B and thermoelements 38A, 38B to one another, and a second heat treatment can be performed to sinter the meta-atoms and/or cause the nanoparticles to coalesce. In some cases, the order of the heat treatments may be reversed.

TEG modules, such as those described above, can be used for heat harvesting in a wide variety of devices and applications, including wearable devices in which the user's body heat is harvested and used by the device. For example, some sensors are capable of monitoring a patient's health conditions. An important requirement for many of these medical sensors is a stable and continuous power supply. Thermoelectric devices capable of generating power by harvesting heat from a human body can be used for that purpose. In particular, the TEG modules described in this disclosure can be integrated with medical and other health-related sensor devices, as well as a wide range of other small consumer electronic devices.

Further, substantially the same configuration described above can be used as a heating and/or cooling device. In such implementations, instead of applying a thermal gradient, a voltage is applied. Such a module may be used, for example, as a micro cooling element for medical applications or integrated into (or placed adjacent) electronic circuitry.

Although the foregoing process described in connection with FIGS. 3A through 8 can be particularly advantageous for manufacturing TEG modules that include thermoelectric elements of different conductivity types, a similar process can be employed to manufacture devices that include respective metastructures connected together electrically in series. For example, the same technique as described above can be used even where the material of the replication layer 30A is the same as the material of the replication layer 30B. Thus, the foregoing technique can be used to fabricate modules that include multiple metastructures composed of the same, or different, material(s). As described above, the meta-atoms 38A, 38B of the metastructures are bonded to electrical contacts such that the meta-atoms of the metastructures are connected electrically in series.

Various modifications will be readily apparent and within the spirit and scope of this disclosure. Accordingly, other implementations are within the scope of the claims.

What is claimed is:

1. A method comprising:
   imprinting a first replication layer to form a first metastructure, wherein the first replication layer is disposed on a surface of a first substrate that includes first electrical contacts, and wherein the first replication layer is composed of nanoparticles embedded in a polymer;
   imprinting a second replication layer to form a second metastructure, wherein the second replication layer is disposed on a surface of a second substrate that includes second electrical contacts, and wherein the second replication layer is composed of nanoparticles embedded in a polymer; and
   bonding meta-atoms of the second metastructure to the first electrical contacts, and bonding meta-atoms of the first metastructure to the second electrical contacts such that respective ones of the meta-atoms of the first metastructure are connected electrically in series with respective ones of the meta-atoms of the second metastructure.

2. The method of claim 1 wherein the first replication layer and the second replication layer have the same composition as one another.

3. The method of claim 1 wherein the first replication layer and the second replication layer have different compositions from one another.

\* \* \* \* \*